United States Patent

McDonald

[11] Patent Number: 5,424,692
[45] Date of Patent: Jun. 13, 1995

[54] SWITCHABLE IMPEDANCE CIRCUIT

[75] Inventor: Mark D. McDonald, Fremont, Calif.

[73] Assignee: National Semiconductor Corporation, Santa Clara, Calif.

[21] Appl. No.: 191,264

[22] Filed: Feb. 3, 1994

[51] Int. Cl.⁶ .................................. H03H 11/28
[52] U.S. Cl. ........................ 333/32; 330/286; 327/208
[58] Field of Search ............ 333/32; 328/167; 330/53, 286, 287; 327/551, 552, 208

[56] References Cited

U.S. PATENT DOCUMENTS

| 4,345,171 | 8/1982 | Harris, Jr. ............ 333/32 X |
| 5,272,722 | 12/1993 | Tran .................... 333/32 X |
| 5,309,124 | 5/1994 | Cazaux et al. ........ 333/32 X |

FOREIGN PATENT DOCUMENTS

| 187701 | 8/1988 | Japan ................... 333/32 |
| 274902 | 12/1991 | Japan ................... 333/32 |
| 154216 | 5/1992 | Japan ................... 333/32 |

Primary Examiner—Paul Gensler
Attorney, Agent, or Firm—Limbach & Limbach; H. Donald Nelson; Richard J. Roddy

[57] ABSTRACT

A switchable impedance circuit and method for maintaining a controlled signal line (e.g. RF transmission line) impedance at a circuit node includes a circuit and method for connecting a switchable impedance in shunt or series, or in a shunt and series combination. The switchable impedance can be selectively switched, e.g. "on" or "off", when the circuit is being powered up or down, or both, so as to maintain the desired, e.g. characteristic, impedance at the node of the signal line to which it is connected, for example by providing the complex conjugate of, or vectorially matching, any complex impedance present at such node, thereby advantageously helping to minimize undesirable transient signal effects, such as circuit ringing or oscillator frequency pulling.

30 Claims, 4 Drawing Sheets

SWITCHABLE IMPEDANCE CIRCUIT

BACKGROUND OF THE INVENTION

1. Field of the Invention

The present invention relates to circuits having specific, controlled signal node impedances, and in particular to circuits for maintaining such specific, controlled signal node impedances.

2. Description of the Related Art

High frequency, e.g. radio frequency (RF), circuits often have input and output signal ports with specific, controlled impedances. These impedances are typically matched to the impedance of transmission lines connecting such circuits. This allows for maximum transfer of power to or from such circuits.

Such high frequency circuits are used in many applications, including mobile wireless communications systems. In mobile, or portable, applications, such circuits are often powered by batteries. Further, such circuits often have power saving features whereby some of the circuitry is powered down when not in use. However, the remaining portion of the circuitry still in use must still see the same specific, controlled impedances at its input and output ports. Impedance changes, which can easily be introduced by those portions of the circuitry being powered down, can adversely affect the remaining circuits which are still powered up. Such adverse effects can include circuit ringing and oscillator frequency pulling.

Conventional approaches to solving this problem of maintaining a desired impedance at a signal node include: (1) placing a constant (and typically low) shunt impedance at the node of interest; (2) allowing some small amount of supply current flow during the powered down state to maintain the circuit impedance; and (3) using external impedance matching elements. However, each of these techniques introduces problems. First, keeping a constant shunt impedance at the node of interest causes loss of signal gain and increased noise due to the additional thermal noise introduced by resistive elements. Second, maintaining some amount of power supply current flow during the otherwise so-called "powered down" state tends to negate any benefits otherwise sought to be achieved by the circuit's power saving features. Third, the use of external impedance matching elements requires the use of extra components, which increases costs and complexity, particularly in an integrated circuit environment.

SUMMARY OF THE INVENTION

A switchable impedance circuit in accordance with a preferred embodiment of the present invention includes a grounding element and a switchable impedance circuit. The grounding element provides a signal grounding path with an associated grounding impedance to circuit ground. The switchable impedance circuit couples to the grounding element a signal node having an associated desired impedance. The switchable impedance circuit receives an impedance control signal and in accordance therewith provides a controlled signal path between the signal node and the grounding element. The controlled signal path has an associated controlled impedance, and a combination of the grounding impedance of the grounding element and the controlled impedance of the controlled signal path substantially matches the desired impedance of the signal node.

In one embodiment, the grounding element is a direct connection to circuit ground. In an alternative embodiment, the grounding element is a circuit component, a combination of circuit components or an active circuit.

In one embodiment, the switchable impedance circuit is a shunt switchable impedance which connects the signal node directly to circuit ground. This shunt switchable impedance can be a plurality of circuit components connected in series or parallel, or a combination of both. In an alternative embodiment, the switchable impedance circuit is a series, or in-line, switchable impedance. This in-line switchable impedance can be a plurality of circuit components in series or parallel, or a combination of both. Such circuit components can include a field-effect transistors (FETs), such as a metal oxide semiconductor FETs (MOSFET), complementary MOSFETs (CMOSFET), gallium arsenide FETs (GaAsFET) or junction FETs (JFET), any of which can be n-channel or p-channel, or enhancement or depletion mode devices, or alternatively, electromechanical switches or relays.

These and other features and advantages of the present invention will be understood upon consideration of the following detailed description of the invention and the accompanying drawings.

DETAILED DESCRIPTION OF THE INVENTION

Figure 1:
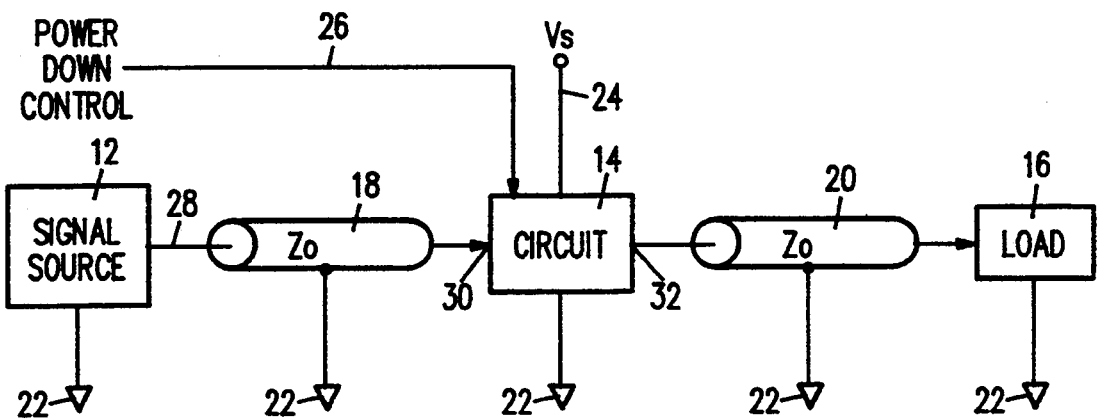
FIG. 1 is a generalized block diagram of a conventional high frequency system.

Referring to FIG. 1, a conventional high frequency system design 10, in generalized form, includes some form of signal source 12 (e.g. oscillator), a circuit 14 and a load 16 (e.g. an antenna, or additional circuits making up a subsystem within the overall system 10). A transmission line 18 with a specific, controlled analog impedance (e.g. $Z_o=50\Omega$ or $Z_o=75\Omega$) conveys the output signal from the signal source 12 to the circuit 14, while in turn, another transmission line 20 conveys the output signal from the circuit 14 to the load 16.

The system elements 12, 14, 16 and transmission lines 18, 20 are grounded to circuit ground 22. The circuit 14 is connected to a power supply 24 for receiving power therefrom. Additionally, the circuit 14 receives a binary power down control signal 26, which controls specific components or subcircuits within the circuit 14 in such a manner as to cause the circuit 14, or portions thereof, to turn off, i.e. enter a powered down condition, or state. The signal source 12 provides a signal 28, which is conveyed by the transmission line 18 to the input port 30 of the circuit 14. In turn, the circuit 14 provides an output signal at its output port 32, which is conveyed by the other transmission line 20 to the load 16.

When the power down control signal 26 is asserted, the circuit 14, or portions thereof, will transition to a powered down state, e.g. turn off. When this happens, typically the analog input impedance ($Z_{IN}$) at the input port 30 and/or the analog output impedance ($Z_{OUT}$) at the output port 32 will change. When such impedance changes occur, ringing can be introduced onto either or both of the transmission lines 18, 20. Additionally, the change in input impedance of the input port 30 can cause frequency pulling of the output signal 28 from the signal source 12.

Figure 2:
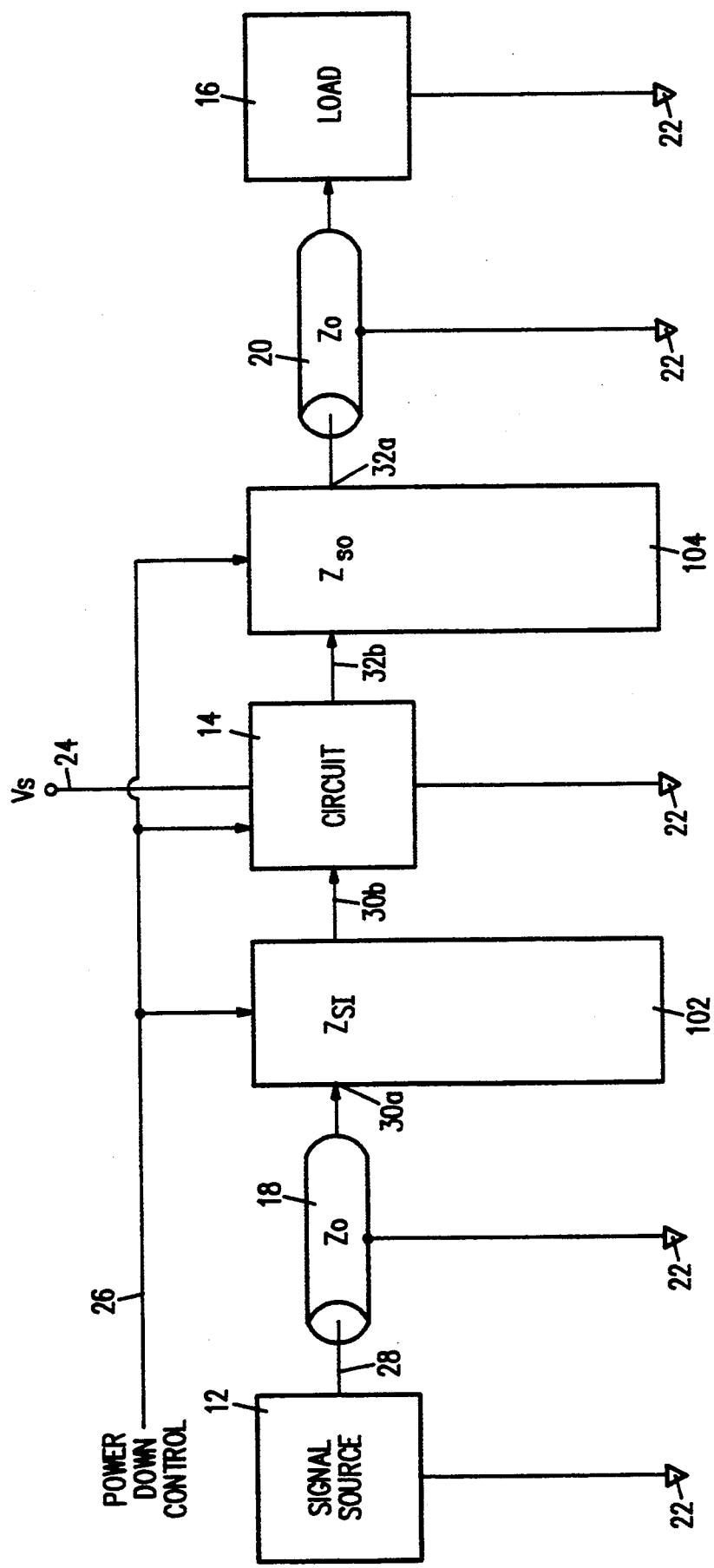
FIG. 2 is a functional block diagram of a high frequency system using switchable impedance circuits in accordance with a preferred embodiment of the present invention.

Referring to FIG. 2, the above-noted problems caused by impedance changes in a circuit in a powered down state can be resolved by using switchable impedance circuits 102, 104 in accordance with the present invention. The switchable impedance circuits 102, 104 receive the same binary power down control signal 26 as the circuit 14 (or a related, e.g. time-delayed, amplitude-scaled, etc., signal). When the power down control signal 26 is asserted, the circuit 14 or portions thereof, transition into a powered down state, as discussed above. However, the input 102 and output 104 switchable impedance circuits also transition into different impedance states.

More particularly, when the power down control signal 26 is asserted, the input 102 and output 104 switchable impedance circuits transition, or switch, into alternative impedance states, whereby the "powered down" input impedance at the input port 30a appears substantially unchanged in relation to the "powered up" input impedance loading the input transmission line 18 and signal source 12. Similarly, the "powered down" output impedance of the output signal port 32a appears unchanged in relation to the "powered up" output impedance driving the output transmission line 20 and load 16. This maintenance of the input 30a and output 32a impedances advantageously prevents signal ringing on the input 18 and output 20 transmission lines. Further, this maintenance of the input impedance 30a prevents any frequency pulling of the output signal 28 from the signal source 12.

As should be recognized by one of ordinary skill in the art, the above-discussed maintenance of a specific, desired signal node impedance will typically take the form of maintaining a fixed resistive impedance, such as that used in the typical 50-ohm RF or 75-ohm video circuit or system. However, the above-described switchable impedance circuits can also be used to match complex impedances. For example, such matching of complex impedances can take the form of matching them vectorially, or providing the complex conjugate thereof.

In accordance with the present invention, a switchable impedance circuit is switched "on" and "off" to accommodate the varying impedance of the circuit 14 between its on and off states. When the circuit 14 is on, i.e. powered up, the switchable impedance circuits 102, 104 are set into states such as to not affect the "on" impedance at the input 30b and output 32b of the circuit 14. When the circuit 14 is off, i.e. powered down, the switchable impedance circuits 102, 104 are set into states such as to maintain the desired, e.g. characteristic, impedance ($Z_o$) of the system 100. The power down control signal 26 which is used to control the powered up/down state of the circuit 14 is used to also control the on/off state of the switchable impedance circuits 102, 104.

The switchable impedance circuits 102, 104 each exhibit one of two states of relative impedance during the time that the circuit 14 is in its powered down state. (As used herein, with respect to the switchable impedance circuits 102, 104, the "off state" corresponds to the powered down state of the circuit 14, and the "on state" corresponds to the powered up state of the circuit 14.) One state of impedance (of the switchable impedance circuits 102, 104) is intended to maintain the desired system impedance when the impedance of the subject signal node, or port, of the circuit 14 is higher in the off state than the on state. Alternatively, the other state of impedance is designed to maintain the desired system impedance when the impedance of the subject signal node of the circuit 14 is lower in the off state than the on state.

Figure 3:
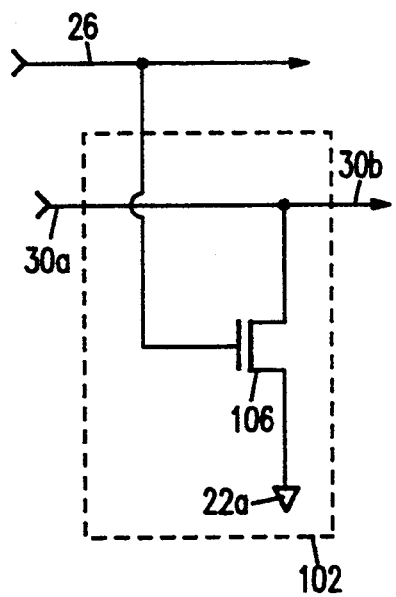
FIG. 3 illustrates schematically a switchable impedance circuit in accordance with a preferred embodiment of the present invention.

Referring to FIG. 3, an input switchable impedance circuit 102 in accordance with a preferred embodiment of the present invention is illustrated schematically. (The following discussion refers to the input switchable impedance circuit 102. However, it should be understood that similar designs can be used to implement the output switchable impedance circuit 104 as well.) In this embodiment, a FET 106 is used to shunt the signal node 30a/30b to circuit ground 22a. In accordance with the assertion or de-assertion of the power down control signal 26, the FET 106 is turned either on or off, thereby either shunting or not shunting the signal node 30a/30b to circuit ground 22a. (Specific characteristics of the FET 106, such as length and width of its gate, can be designed according to conventional techniques to implement desired impedance characteristics.)

As should be understood, the circuit ground node, or connection, 22a represented in FIG. 3 can represent either the actual circuit ground 22, as shown in FIGS. 1 and 2, or it can be an effective circuit ground, e.g. an AC ground through a power supply or decoupling capacitor.

The FET 106 is designed so as to provide a grounding path with an associated grounding impedance between the signal node 30a/30b and ground 22a, which in its parallel relationship with the input impedance of the input port 30b of the powered down circuit 14 maintains the desired system impedance at the signal node 30a/30b with respect to ground 22. When the power down control signal 26 is asserted, the FET 106 is turned on, and when the power down control signal 26 is de-asserted, the FET 106 is turned off.

Figure 4A:
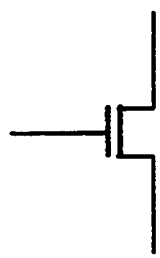
FIGS. 4A, 4B and 4C illustrate schematically various forms of FETs which can be used in a switchable impedance circuit in accordance with the present invention.
Figure 4B:
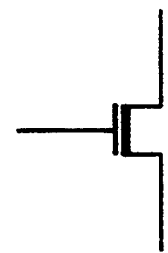
Figure 4C:
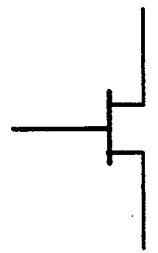

As noted above, the FET 106 can be any of several forms of field-effect transistors, including but not limited to MOSFETs or CMOSFETs (FIG. 4A), depletion-mode MOSFETs (FIG. 4B), or JFETs or GaAs-FETs (FIG. 4C). Further, either n-channel or p-channel, or enhancement or depletion mode devices can be used. Alternatively, electromechanical switches or relays (e.g. co-axial switches) can be used to perform a "switching" function similar to that of the FET 106.

Figure 5:
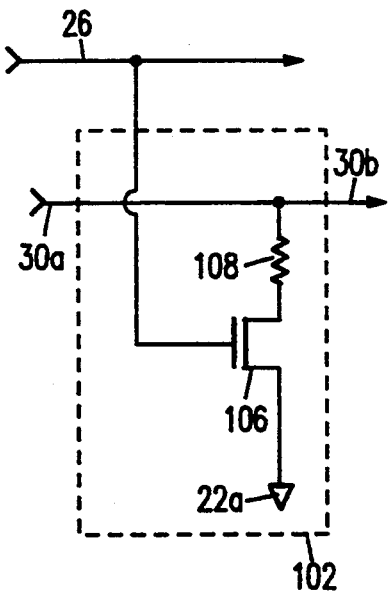
FIGS. 5 through 7 illustrate schematically alternative switchable impedance circuits in accordance with a preferred embodiment of the present invention.

Referring to FIG. 5, an alternative shunt switchable impedance circuit in accordance with a preferred embodiment of the present invention includes a series circuit combination of the FET 106 and an impedance (e.g. resistor) 108. As in FIG. 3, when the power down control signal 26 is asserted, the FET 106 is turned on, and when the power down control signal 26 is de-asserted, the FET 106 is turned off. In this embodiment, the turned-on FET 106 can have a lower drain-to-source resistance since the impedance 108 in series therewith provides additional impedance.

Figure 6:
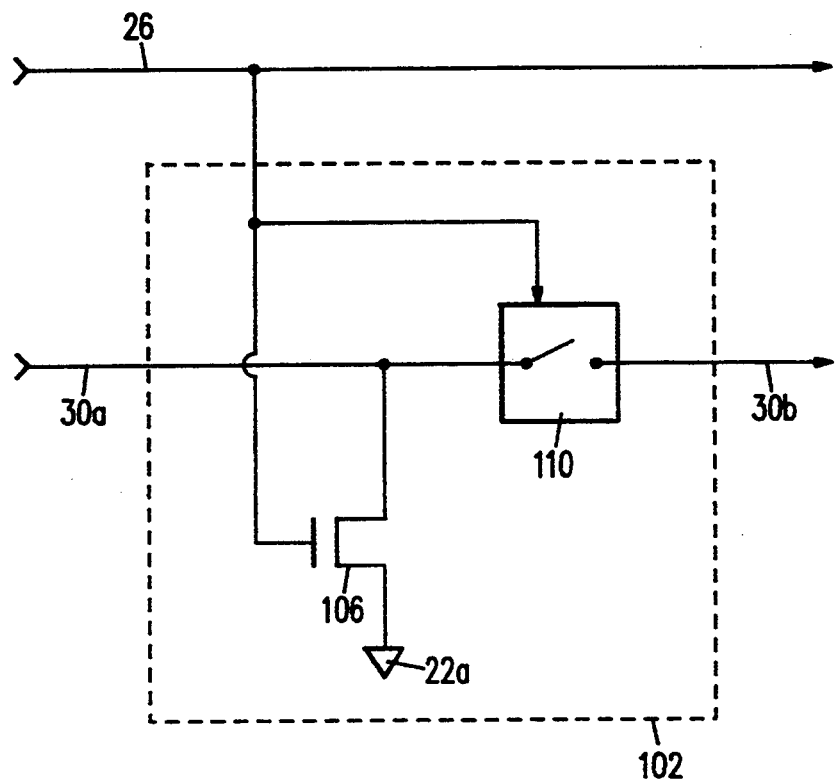
Figure 7:
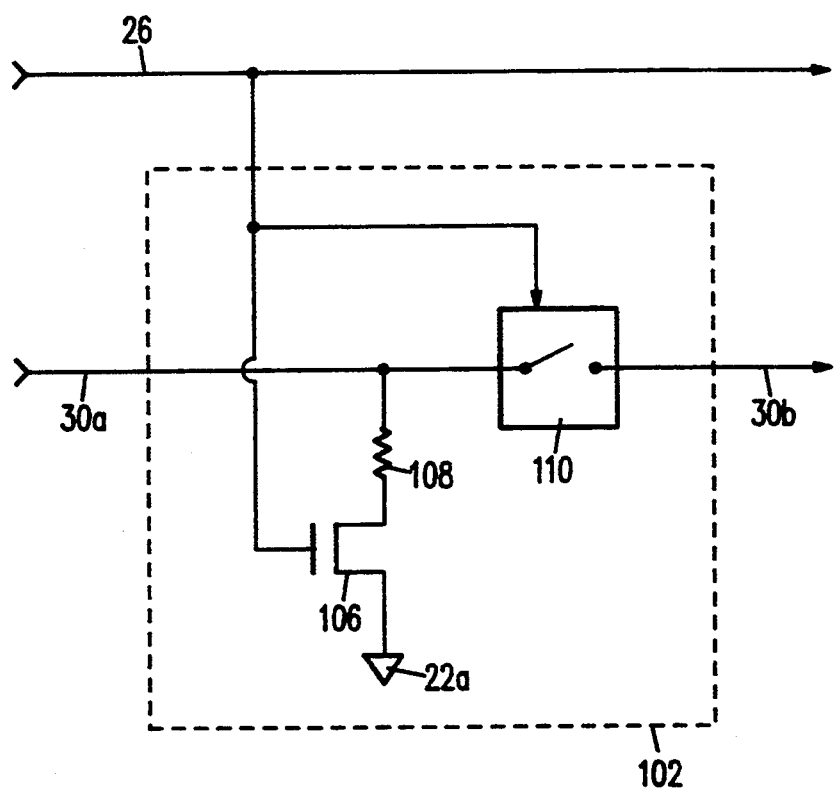

Referring to FIGS. 6 and 7, further alternative embodiments of a switchable impedance circuit in accordance with a preferred embodiment of the present invention includes the use of a switch 110. These embodiments can be used when the input impedance at the input node 30b of the circuit 14 is lower in the off state than the on state thereof. The switch 110, controlled by the power down control signal 26, serves to isolate the input node 30b of the circuit 14 from the signal node 30a whose impedance is sought to be maintained. With the switch 110 in its off state, the FET 106 (FIG. 6), or series FET 106 and resistor 108 combination (FIG. 7), can be used to maintain or match the impedance at the signal node 30a, as discussed above.

Figure 8:
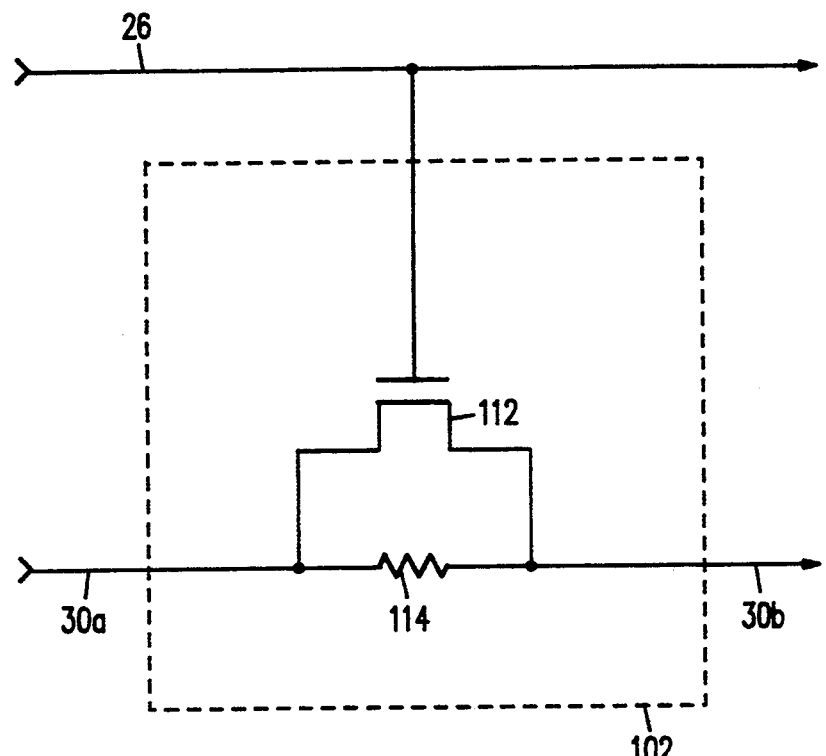
FIGS. 8 and 9 illustrate schematically switchable impedance circuits in accordance with an alternative preferred embodiment of the present invention.

Referring to FIG. 8, a switchable impedance circuit in accordance with an alternative preferred embodiment of the present invention includes a parallel combination of a FET 112 and resistor 114 in series with the input port 30b of the circuit 14 and the signal node 30a whose impedance is sought to be matched or maintained. In accordance with the assertion and de-assertion of the power down control signal 26, the FET 112 is turned on and off. When the FET 112 is off, i.e. when the circuit 14 is powered down, the resistor 114, in series with the impedance at the input port 30b of the powered down circuit 14, maintains the desired impedance at the signal node 30a. When the FET 112 is turned on, i.e. when the circuit 14 is powered up, the net impedance of the parallel combination of the resistor 114 and drain-to-source impedance of the FET 112 is in series with the input impedance at the input port 30b of the powered up circuit 14, and matches that of the desired impedance at the signal node 30a.

As should be recognized, depending upon the type of FET used, e.g. enhancement or depletion mode, an inverter, or plurality of inverters, for inverting the logic state of the power down control signal 26 may be needed so as to ensure that the respective switchable impedance circuits 102, 104 are turned on and off when appropriate relative to the on and off states of the circuit 14.

Figure 9:
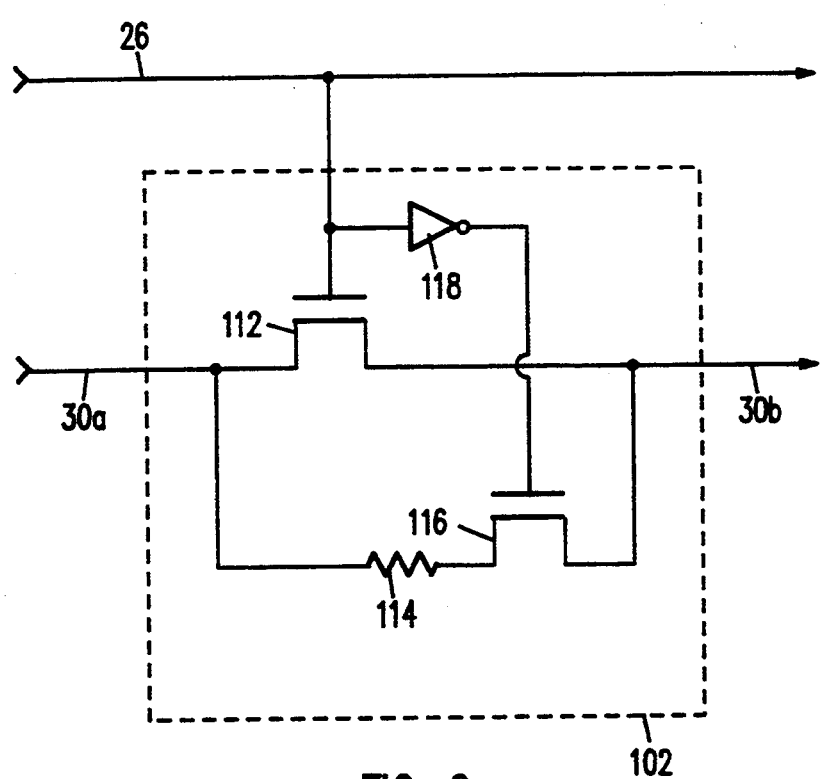

Referring to FIG. 9, another switchable impedance circuit in accordance with an alternative preferred embodiment of the present invention includes, in addition to the FET 112 and resistor 114, another FET 116 and an inverter 118, connected as shown. In this embodiment, when the circuit 14 is powered down, the first FET 112 is turned off and the second FET 116 is turned on. Thus, the series combination of the resistor 114 and drain-to-source impedance of the FET 116 provide a net impedance which is in series with that of the powered down input impedance at the input port 30b of the circuit 14. Conversely, when the circuit 14 is turned on, the first FET 112 is turned on and the second FET 116 is turned off. Hence, the drain-to-source impedance of the first FET 112 is the only impedance which adds to that of the input impedance at the input port 30b of the turned-on circuit 14.

The series, or in-line, FETS 112, 116 shown in FIGS. 8 and 9, can be designed to serve as switches, i.e. with minimal drain-to-source impedances when turned on, or alternatively, to serve as specific impedances when in their on states.

In accordance with a preferred embodiment of the present invention, the aforementioned impedances 108 and 114 (FIGS. 5, 7, 8 and 9) are resistors. However, it should be understood that other forms of impedance, such as capacitors or inductors, or various combinations (e.g. series or parallel) of capacitors, inductors or resistors, can be used as well to achieve any desired value of complex impedance. (It should be further understood that the positioning of the FETs 106 and 116 and impedance 108 can be interchanged as desired, e.g. with the impedance 108 coupled directly to circuit ground 22a and the FET 106 coupled between the circuit node 30a/30b and the impedance 108 (FIGS. 5 and 7), or with the impedance 114 coupled to the "output" node 30b and the FET 106 coupled between the "input" node 30a and the impedance 114 (FIG. 9).

The foregoing discussion has been in the context of single-ended types of circuits. However, it should be understood that switchable impedance circuits in accordance with the present invention can also be used with differential circuits, e.g. with a switchable impedance used at each side of a differential circuit node.

As can be seen from the foregoing, the aforementioned problems associated with the prior art are avoided. For example, loss in signal gain or increased noise due to thermal noise introduced by resistive elements can be avoided by the above-described switchable impedance circuits which are used only when the subject circuit is in its powered down state. Also, current consumption during the powered down state can be avoided, or at least greatly minimized, particularly since FETs are used. Further, very few additional components are needed, and most of those that are, i.e. FETs, are inexpensive and quite small, and therefore easy to include in an integrated circuit design.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A switchable impedance circuit for selectively maintaining a desired analog signal line impedance at a circuit node, comprising:

grounding means for providing a signal grounding path to a circuit ground, wherein said signal grounding path has an analog grounding impedance associated therewith; and switchable impedance means, coupled to said grounding means, for coupling to a signal node which has associated therewith a desired analog impedance, and for coupling to a control node and receiving therefrom a binary impedance control signal and in accordance therewith providing a controlled analog signal path between said signal node and said grounding means, wherein said controlled analog signal path has a controlled nonzero analog impedance associated therewith, and wherein a combination of said analog grounding impedance and said controlled nonzero analog impedance substantially matches said desired analog impedance.

2. A switchable impedance circuit as recited in claim 1, wherein said grounding means comprises a circuit ground node.

3. A switchable impedance circuit as recited in claim 2, wherein said switchable impedance means comprises a shunt switchable impedance circuit.

4. A switchable impedance circuit as recited in claim 2, wherein said switchable impedance means comprises a parallel switchable impedance circuit.

5. A switchable impedance circuit as recited in claim 1, wherein said grounding means comprises a circuit element having an analog circuit impedance associated therewith which comprises said analog grounding impedance.

6. A switchable impedance circuit as recited in claim 1, wherein said switchable impedance means comprises a field-effect transistor (FET).

7. A switchable impedance circuit as recited in claim 1, wherein said switchable impedance means comprises a field-effect transistor (FET) and a resistor coupled thereto.

8. A switchable impedance circuit as recited in claim 1, wherein said switchable impedance means comprises a parallel switchable impedance circuit.

9. A switchable impedance circuit for selectively maintaining a desired analog signal line impedance at a circuit node, comprising:
a ground path which provides a signal grounding path to a circuit ground, wherein said signal grounding path has an analog grounding impedance associated therewith; and
a switchable impedance, coupled to said ground path, which couples to a signal node having associated therewith a desired analog impedance, and which couples to a control node and receives therefrom a binary impedance control signal and in accordance therewith provides a controlled analog signal path between said signal node and said ground path, wherein said controlled analog signal path has a controlled nonzero analog impedance associated therewith, and wherein a combination of said analog grounding impedance and said controlled nonzero analog impedance substantially matches said desired analog impedance.

10. A switchable impedance circuit as recited in claim 9, wherein said ground path comprises a circuit ground node.

11. A switchable impedance circuit as recited in claim 10, wherein said switchable impedance comprises a shunt switchable impedance circuit.

12. A switchable impedance circuit as recited in claim 10, wherein said switchable impedance comprises a parallel switchable impedance circuit.

13. A switchable impedance circuit as recited in claim 9, wherein said ground path comprises a circuit element having an analog circuit impedance associated therewith which comprises said analog grounding impedance.

14. A switchable impedance circuit as recited in claim 9, wherein said switchable impedance comprises a field-effect transistor (FET).

15. A switchable impedance circuit as recited in claim 9, wherein said switchable impedance comprises a field-effect transistor (FET) and a resistor coupled thereto.

16. A switchable impedance circuit as recited in claim 9, wherein said switchable impedance comprises a parallel switchable impedance circuit.

17. A switchable impedance method for selectively maintaining a desired analog signal line impedance at a circuit node, comprising the steps of:
providing a signal grounding path, which has associated therewith an analog grounding impedance, to a circuit ground; and
coupling a signal node, which has associated therewith a desired analog impedance, to said signal grounding path via a switchable impedance;
coupling control node and receiving therefrom a binary impedance control signal and in accordance therewith providing a controlled analog signal path between said signal node and said signal grounding path, wherein said controlled analog signal path has a controlled nonzero analog impedance associated therewith, and wherein a combination of said analog grounding impedance and said controlled nonzero analog impedance substantially matches said desired analog impedance.

18. A switchable impedance method as recited in claim 17, wherein said step of providing a signal grounding path, which has associated therewith an analog grounding impedance, to a circuit ground comprises connecting to a circuit ground node.

19. A switchable impedance method as recited in claim 18, wherein said step of coupling a signal node, which has associated therewith a desired analon impedance, to said signal grounding path via a switchable impedance comprises coupling said signal node to a circuit ground via a shunt switchable impedance circuit.

20. A switchable impedance method as recited in claim 18, wherein said step of coupling a signal node, which has associated therewith a desired analog impedance, to said signal grounding path via a switchable impedance comprises coupling said signal node to a circuit ground via a parallel switchable impedance circuit.

21. A switchable impedance method as recited in claim 17, wherein said step of providing a signal grounding path, which has associated therewith an analog grounding impedance, to a circuit ground comprises connecting to a circuit element having an analog circuit impedance associated therewith which comprises said grounding impedance.

22. A switchable impedance method as recited in claim 17, wherein said step of coupling a signal node, which has associated therewith a desired analog impedance, to said signal grounding path via a switchable impedance comprises coupling said signal node to said signal grounding path via a field-effect transistor (FET).

23. A switchable impedance method as recited in claim 17, wherein said step of coupling a signal node, which has associated therewith a desired analog impedance, to said signal grounding path via a switchable impedance comprises coupling said signal node to said signal grounding path via a field-effect transistor (FET) and a resistor.

24. A switchable impedance method as recited in claim 17, wherein said step of coupling a signal node, which has associated therewith a desired analog impedance, to said signal grounding path via a switchable impedance comprises coupling said signal node to said signal grounding path via a parallel switchable impedance circuit.

25. A switchable impedance circuit for selectively maintaining a desired analog signal line impedance at a circuit node, comprising:
grounding means for providing a signal grounding path to a circuit ground, wherein said signal grounding path has an analog grounding impedance associated therewith, and wherein said grounding means comprises a circuit ground node; and switchable impedance means, coupled to said grounding means, for coupling to a signal node which as associated therewith a desired analog impedance, and for receiving a binary impedance control signal and in accordance therewith providing a controlled analog signal path between said signal node and said grounding means, wherein said controlled analog signal path has a controlled analog impedance associated therewith, and wherein a combination of said analog grounding impedance and said controlled analog impedance substantially matches said desired analog impedance, and further wherein said switchable impedance means comprises a series switchable impedance circuit.

26. A switchable impedance circuit for selectively maintaining a desired analog signal line impedance at a circuit node, comprising:

grounding means for providing a signal grounding path to a circuit ground, wherein said signal grounding path has an analog grounding impedance associated therewith; and switchable impedance means, coupled to said grounding means, for coupling to a signal node which has associated therewith a desired analog impedance and said controlled analog impedance control signal and in accordance therewith providing a controlled analog signal path between said signal node andsaid grounding means, wherein said controlled analog signal pth as a controlled analog impedance associated therewith, and where with a combintion of said analog grounding impedance and said controlled analog impedance substantially matches said desired analog impedance, and further wherein said switchable impedance means comprises a series switchable impedance circuit.

27. A switchable impedance circuit for selectively maintaining a desired analog signal line impedance at a circuit node, comprising:

a ground path which provides a signal grounding path to a circuit ground, wherein said signal grounding path has an analog grounding impedance associated therewith, and wherein said ground path comprises a circuit ground node; and a switchable impedance, coupled to said ground path, which couples to a signal node having associated therewith a desired analog impedance, and which receives a binary impedance control signal and in accordance therewith provides a controlled analog signal path between said signal node and said ground path, wherein said controlled analog signal path has a controlled analog impedance associated therewith, and wherein a combination of said analog grounding impedance and said controlled analog impedance substantially matches said desired analog impedance, and further wherein said switchable impedance comprises a series switchable impedance circuit.

28. A switchable impedance circuit for selectively maintaining a desired analog signal line impedance at a circuit node, comprising:

a ground path which provides a signal grounding path to a circuit ground, wherein said signal grounding path has an analog grounding impedance associated therewith; and a switchable impedance, coupled to said ground path, which couples to a signal node having associated therewith a desired analog impedance, and which receives a binary impedance control signal and in accordance therewith provides a controlled analog signal path between said signal node and said ground path, wherein said controlled analog signal path has a controlled analog impedance associated therewith, and wherein a combination of said analog grounding impedance and said controlled analog impedance substantially matches said desired analog impedance, and further wherein said switchable impedance comprises a series switchable impedance circuit.

29. A switchable impedance method for selectively maintaining a desired analog signal line impedance at a circuit node, comprising the steps of:

providing a signal grounding path, which has associated therewith an analog grounding impedance, to a circuit ground by connecting to a circuit ground node; and coupling a signal node, which has associated therewith a desired analog impedance, to said signal grounding path via a switchable impedance by coupling said signal node to a circuit ground via a series switchable impedance circuit;

receiving a binary impedance control signal and in accordance therewith providing a controlled analog signal path between said signal node and said signal grounding path, wherein said controlled analog signal path has a controlled analog impedance associated therewith, and wherein a combination of said analog grounding impedance and said controlled analog impedance substantially matches said desired analog impedance.

30. A switchable impedance method for selectively maintaining a desired analog signal line impedance at a circuit node, comprising the steps of:

providing a signal grounding path, which has associated therewith an analog grounding impedance, to a circuit ground; and coupling a signal node, which has associated therewith a desired analog impedance, to said signal grounding path via a switchable impedance by coupling said signal node to said signal grounding path via a series switchable impedance circuit;

receiving a binary impedance control signal and in accordance therewith providing a controlled analog signal path between said signal node and said signal grounding path, wherein said controlled analog signal path has a controlled analog impedance associated therewith, and wherein a combination of said analog grounding impedance and said controlled analog impedance substantially matches said desired analog impedance.

* * * * *

UNITED STATES PATENT AND TRADEMARK OFFICE
CERTIFICATE OF CORRECTION

PATENT NO. : 5,424,692
DATED : June 13, 1995
INVENTOR(S) : Mark Douglas McDonald It is certified that error appears in the above-indentified patent and that said Letters Patent is hereby corrected as shown below:

In Col. 8, line 21, please delete "analon" and replace with --analog--.

In Col. 9, line 3, please please add an --h-- before "as" to form the word "has".

In Col. 9, line 28, please insert a --,-- after the first occurrence of the word "impedance".

Signed and Sealed this

Fifth Day of September, 1995

Attest:

BRUCE LEHMAN

Attesting Officer     Commissioner of Patents and Trademarks